United States Patent
Sugihara (10) Patent No.: US 10,634,325 B2
(45) Date of Patent: Apr. 28, 2020

(54) MOUNTING DEVICE

(71) Applicant: FUJI CORPORATION, Chiryu-shi (JP)

(72) Inventor: Kohei Sugihara, Nishio (JP)

(73) Assignee: FUJI CORPORATION, Chiryu-shi (JP)

( * ) Notice: Subject to any disclaimer, the term of this patent is extended or adjusted under 35 U.S.C. 154(b) by 124 days.

(21) Appl. No.: 15/501,689

(22) PCT Filed: Aug. 4, 2014

(86) PCT No.: PCT/JP2014/070507
§ 371 (c)(1),
(2) Date: Feb. 3, 2017

(87) PCT Pub. No.: WO2016/020975
PCT Pub. Date: Feb. 11, 2016

(65) Prior Publication Data
US 2017/0227199 A1    Aug. 10, 2017

(51) Int. Cl.
*G05B 15/00* (2006.01)
*F21V 21/15* (2006.01)
(Continued)

(52) U.S. Cl.
CPC ............ *F21V 21/15* (2013.01); *F21V 5/04* (2013.01); *F21V 19/003* (2013.01);
(Continued)

(58) Field of Classification Search
CPC .................... F21V 5/04; G06T 7/74
See application file for complete search history.

(56) References Cited

U.S. PATENT DOCUMENTS 5,943,586 A    8/1999 Koizumi et al.
6,023,104 A    2/2000 Koizumi et al.
(Continued)

FOREIGN PATENT DOCUMENTS

AU    513747 A4    7/2014
CN    103079392 A    5/2013
(Continued)

OTHER PUBLICATIONS

JP 2000183404(A) (Fuji Photo Film Co Ltd) Jun. 30, 2000, whole document. Patent Translate (Year: 2000).*
(Continued)

*Primary Examiner* — Mohammad Ali
*Assistant Examiner* — Sheela Rao
(74) *Attorney, Agent, or Firm* — Oblon, McClelland, Maier & Neustadt, L.L.P.

(57) ABSTRACT

A mounting device includes a control device. The control device images an imaging range which includes an illuminant of a light emitting component and acquires a light emitting component image when mounting the light emitting component which includes the illuminant onto a board. Next, the control device detects coordinates (illuminant detected center coordinates) of a center of the illuminant based on the light emitting component image. The control device performs the mounting of the light emitting component such that the light emitting component is held, the light emitting component moves over the board, and a center of the illuminant is positioned at predetermined coordinates on the board based on the illuminant detected center coordinates, without using information relating to an outer shape of the light emitting component which is based on the light emitting component image.

11 Claims, 6 Drawing Sheets

(51) Int. Cl.
| | | |
|---|---|---|
| *H01L 23/00* | (2006.01) | |
| *H01L 33/00* | (2010.01) | |
| *H05K 13/08* | (2006.01) | |
| *G06T 7/73* | (2017.01) | |
| *F21V 5/04* | (2006.01) | |
| *F21V 19/00* | (2006.01) | |
| *G05B 19/402* | (2006.01) | |
| *G06T 7/00* | (2017.01) | |
| *H01L 21/68* | (2006.01) | |
| *H01L 33/48* | (2010.01) | |

(52) U.S. Cl.
CPC ............ *G05B 19/402* (2013.01); *G06T 7/001* (2013.01); *G06T 7/74* (2017.01); *H01L 21/681* (2013.01); *H01L 24/75* (2013.01); *H01L 33/00* (2013.01); *H01L 33/0095* (2013.01); *H01L 33/486* (2013.01); *H05K 13/0815* (2018.08); *G05B 2219/40003* (2013.01); *G06T 2207/30204* (2013.01); *H01L 2224/75745* (2013.01); *H01L 2224/75753* (2013.01); *H01L 2224/75901* (2013.01); *H01L 2924/12041* (2013.01); *H01L 2933/0033* (2013.01)

(56) References Cited

U.S. PATENT DOCUMENTS

| | | |
|---|---|---|
| 6,208,419 B1 | 3/2001 | Yamamoto et al. |
| 6,266,891 B1 | 7/2001 | Yamamoto |
| 6,369,884 B1 | 4/2002 | Yamamoto et al. |
| 6,931,716 B2 * | 8/2005 | Suhara ............... H05K 13/0812 29/740 |
| 6,956,879 B2 | 10/2005 | Tatsuta et al. |
| 8,015,696 B2 | 9/2011 | Fukunaga |
| 2002/0035783 A1* | 3/2002 | Kawada ............ H05K 13/0452 29/833 |
| 2006/0209910 A1 | 9/2006 | Fukunaga |
| 2009/0189949 A1 | 7/2009 | Wu |
| 2009/0251918 A1 | 10/2009 | Engl et al. |
| 2009/0269704 A1 | 10/2009 | Hodono |
| 2010/0053929 A1 | 3/2010 | Bisberg |
| 2010/0284198 A1 | 11/2010 | Willwohl et al. |
| 2012/0249484 A1* | 10/2012 | Hata ..................... G06F 3/0421 345/175 |
| 2013/0245988 A1 | 9/2013 | Lai |
| 2013/0288404 A1* | 10/2013 | Nonomura .......... H01L 33/0095 438/16 |

FOREIGN PATENT DOCUMENTS

| | | |
|---|---|---|
| JP | 55-100514 A | 7/1980 |
| JP | 60-12786 A | 1/1985 |
| JP | 1-209578 A | 8/1989 |
| JP | 6-24040 A | 2/1994 |
| JP | 6-45652 A | 2/1994 |
| JP | 2000-150970 A | 5/2000 |
| JP | 2000-183404 A | 6/2000 |
| JP | 2002-365019 A | 12/2002 |
| JP | 2004-172418 A | 6/2004 |
| JP | 2004-207655 A | 7/2004 |
| JP | 2005-26619 A | 1/2005 |
| JP | 2006-310653 A | 11/2006 |
| JP | 2007-87608 A | 4/2007 |
| KR | 10-2010-0108969 A | 10/2010 |
| KR | 10-2011-0060868 A | 6/2011 |
| KR | 10-2013-0006895 A | 1/2013 |
| WO | WO2012-128094 A1 | 9/2012 |

OTHER PUBLICATIONS

Extended European Search Report dated Apr. 20, 2017 in Patent Application No. 14899223.3.
International Search Report dated Apr. 7, 2015 in PCT/JP2014/070507 filed Aug. 4, 2014.

* cited by examiner

MOUNTING DEVICE

TECHNICAL FIELD

The present application relates to a mounting device.

BACKGROUND ART

In the related art, there is known a mounting device which mounts a light emitting component, which is provided with an illuminant such as an LED, onto a board. There is known a mounting device which accurately positions a light emitting center of the illuminant on the board even in a case in which the positional accuracy of the illuminant in the light emitting component is poor. For example, a bonding device described in PTL 1 first captures an image in a state in which the light emitting component is caused to emit light, and calculates relative coordinates between the light emitting center and an outer shape reference point of the light emitting component based on the image. Next, the device images the light emitting component in a state in which the light emitting component is held by holding means, and recognizes the outer shape reference point of the light emitting component based on the captured image. The device calculates the position of the light emitting center based on the outer shape reference point which is recognized and the relative coordinates which are calculated, and in a case in which a positional deviation amount between the position and a bonding position is great, the bonding position is corrected, and the light emitting component is bonded onto the board.

CITATION LIST

Patent Literature

PTL 1: JP-A-2000-150970

SUMMARY

As described above, in PTL 1, it is necessary to calculate the relative coordinates between the light emitting center and the outer shape reference point of the light emitting component based on the captured image in order to accurately position the light emitting center on the board. However, due to reasons such as the visual field of imaging means being narrow, for example, there is a case in which the illuminant and the outer shape reference point of the light emitting component may not be imaged as a single image. In this case, the relative coordinates between the light emitting center and the outer shape reference point may not be calculated from the image, and the method described in PTL 1 may not be used.

The present disclosure is made in light of this problem, and the main object of the present disclosure is to accurately position an illuminant on a board without using information relating to the outer shape of a light emitting component which is based on a light emitting component image.

The present disclosure adopts the following means in order to achieve the above-described main object.

A first mounting device of the present disclosure is a mounting device which mounts a light emitting component which includes an illuminant onto a board, including component holding means which is capable of holding the light emitting component, moving means for causing the component holding means to move, imaging means for imaging a region which includes at least a portion of the illuminant in the light emitting component to acquire a light emitting component image, illuminant coordinates detection means for detecting coordinates of a specific part of the illuminant based on the light emitting component image, and control means for controlling the component holding means and the moving means to perform mounting of the light emitting component such that the light emitting component is held, the light emitting component moves over the board, and the specific part of the illuminant is disposed at predetermined coordinates on the board based on coordinates of the specific part which are detected, without using the information relating to an outer shape of the light emitting component which is based on the light emitting component image.

In the first mounting device of the present disclosure, a region which includes at least a portion of the illuminant in the light emitting component is imaged and the light emitting component image is acquired when mounting the light emitting component which includes the illuminant onto the board. Next, the coordinates of the specific part of the illuminant are detected based on the light emitting component image. The component holding means and the moving means are controlled to perform the mounting of the light emitting component such that the light emitting component is held, the light emitting component moves over the board, and a specific part of the illuminant is positioned at predetermined coordinates on the board based on the coordinates of the specific part which are detected, without using information relating to an outer shape of the light emitting component which is based on the light emitting component image. In this manner, the mounting is performed using the coordinates of the specific part of the illuminant as a reference instead of the coordinates of the light emitting component. Therefore, even if the position of the illuminant in the light emitting component is deviated from the design value, it is possible to accurately position the illuminant on the board. It is possible to position the illuminant without using the information relating to the outer shape of the light emitting component which is based on a light emitting component image. The light emitting component may be capable of being mounted such that the specific part of the illuminant is resultantly disposed at the predetermined coordinates on the board, and it is not necessary to store the predetermined coordinates on the board in advance, to derive the predetermined coordinates on the board, or the like.

In the first mounting device of the present disclosure, the mounting device further includes positional relationship storage means for storing a positional relationship between coordinates of the specific part of the illuminant and holding coordinates at which the component holding means holds the light emitting component, and mounting coordinates storage means for storing mounting coordinates on the board in the positional relationship with the predetermined coordinates on the board, and the control means may derive actual holding coordinates which are in the positional relationship with coordinates of the specific part based on coordinates of the specific part which are detected and the positional relationship, and may control the component holding means and the moving means such that the light emitting component is held at the actual holding coordinates and a portion which is held is disposed at the mounting coordinates. In the mounting device, the actual holding coordinates at which the light emitting component is held during the mounting are determined using the coordinates of the specific part of the illuminant which are detected from the light emitting component image as a reference. Therefore, even if the position of the illuminant in the light emitting component is deviated from the design value, the positional relationship between the specific part of the illuminant and the portion which is held in the light emitting component is always fixed. Accordingly, it is possible to accurately position the specific part of the illuminant at predetermined coordinates on the board by simply positioning the portion which is held at the mounting coordinates which are stored in advance.

In this case, the positional relationship may be a positional relationship between the specific part of the illuminant and a center of the light emitting component in a case in which a position of the illuminant in the light emitting component is according to the design value. By doing so, in a case in which the position of the illuminant in the light emitting component is according to the design value, the center position of the light emitting component becomes the actual holding coordinates. In a case in which the position of the illuminant is deviated from the design value, a position which is deviated from the center position of the light emitting component by the amount becomes the actual holding coordinates. In other words, a position which corresponds to the positional deviation of the illuminant using the center position of the light emitting component as a reference becomes the actual holding coordinates. Therefore, in comparison to a case in which the actual holding coordinates are defined using the vicinity of the end portion of the light emitting component as a reference, for example, the actual holding coordinates are deviated from the light emitting component, and it becomes difficult for a state to arise in which the light emitting component may not be held.

In the first mounting device of the present disclosure, the control means may derive a positional relationship between coordinates of the specific part which are detected and predetermined holding coordinates at which the component holding means holds the light emitting component, and may control the component holding means and the moving means such that the specific part of the illuminant is positioned at predetermined coordinates on the board based on the positional relationship. By doing so, since the positional relationship between the predetermined holding coordinates of the light emitting component and the coordinates of the specific part of the detected illuminant is derived, and the mounting of the light emitting component is performed based on the positional relationship, it is possible to accurately position the specific part of the illuminant at predetermined coordinates on the board.

In the first mounting device of the present disclosure, the imaging means may be a mark camera which is capable of imaging a mark which is on the board. By doing so, since the mark camera also serves as the imaging means for imaging the light emitting component, it is possible to reduce the number of components of the mounting device. In the mark camera, there is a case in which the visual field is narrow, and the illuminant and the outer shape portion of the light emitting component may not be imaged as a single image. In other words, there is a case in which an image, from which it is possible to acquire both the coordinates of the specific part of the illuminant and information relating to the outer shape of the light emitting component, may not be captured. Therefore, there is a great meaning to applying the present disclosure which does not use the information relating to the outer shape of the light emitting component which is based on the light emitting component image.

The second mounting device of the present disclosure is a mounting device which mounts a light emitting component which includes an illuminant onto a board, including component holding means which is capable of holding the light emitting component, moving means for causing the component holding means to move, imaging means for imaging a region which includes at least a portion of the illuminant in the light emitting component to acquire a light emitting component image, positional relationship storage means for storing a positional relationship between coordinates of a specific part of the illuminant and holding coordinates at which the component holding means holds the light emitting component, illuminant coordinates detection means for detecting coordinates of the specific part of the illuminant based on the light emitting component image, and control means for deriving actual holding coordinates which are in the positional relationship with coordinates of the specific part which are detected without using information relating to an outer shape of the light emitting component which is based on the light emitting component image and for controlling the component holding means and the moving means to perform mounting of the light emitting component such that the light emitting component is held at the actual holding coordinates and the portion which is held is disposed at predetermined mounting coordinates.

In the second mounting device of the present disclosure, a region which includes at least a portion of the illuminant in the light emitting component is imaged and the light emitting component image is acquired when mounting the light emitting component which includes the illuminant onto the board. Next, the coordinates of the specific part of the illuminant are detected based on the light emitting component image. Next, the actual holding coordinates which are in the predetermined positional relationship with the coordinates of the specific part which are detected is derived without using the information relating to the outer shape of the light emitting component which is based on a light emitting component image. The component holding means and the moving means are controlled to perform the mounting of the light emitting component such that the light emitting component is held at the actual holding coordinates and the portion which is held is disposed at the predetermined mounting coordinates. In this manner, the actual holding coordinates at which the light emitting component is held during the mounting are determined using the coordinates of the specific part of the illuminant which are detected from the light emitting component image as a reference. Therefore, even if the position of the illuminant in the light emitting component is deviated from the design value, the positional relationship between the specific part of the illuminant and the portion which is held in the light emitting component is always fixed. Accordingly, by positioning the portion which is held at the predetermined mounting coordinates, the specific part of the illuminant is always positioned at the coordinates which are in the predetermined positional relationship from the mounting coordinates. Therefore, even if the position of the illuminant in the light emitting component is deviated from the design value, it is possible to accurately position the illuminant on the board. It is possible to position the illuminant without using the information relating to the outer shape of the light emitting component which is based on a light emitting component image.

In the second mounting device of the present disclosure, various aspects of the first mounting device of the present disclosure which is described above may be adopted. For example, the positional relationship may be a positional relationship between the specific part of the illuminant and a center of the light emitting component in a case in which a position of the illuminant in the light emitting component is according to the design value. The imaging means may be a mark camera which is capable of imaging a mark which is on the board.

DESCRIPTION OF EMBODIMENTS

Figure 1:
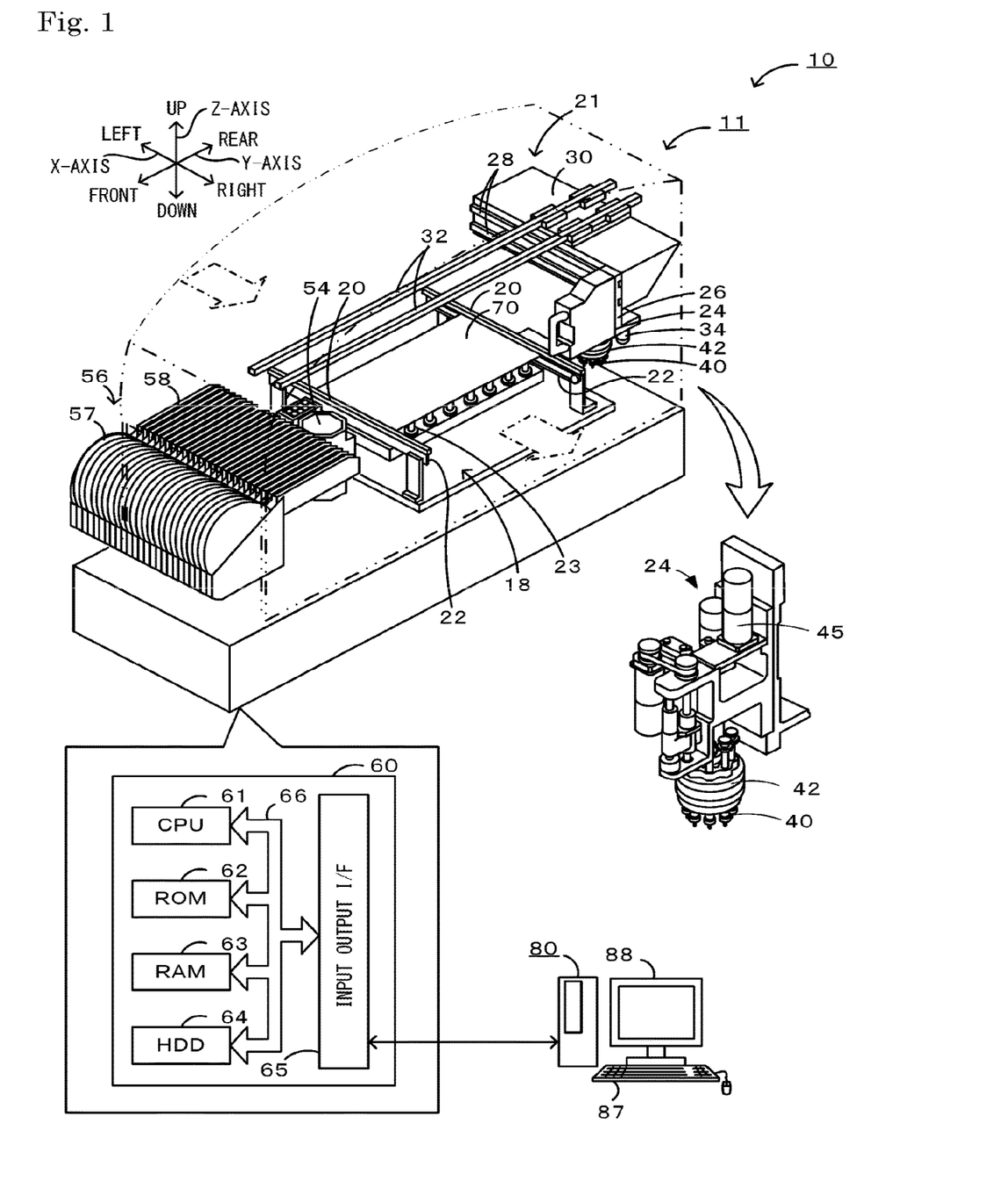
FIG. 1 is a schematic explanatory diagram of a mounting system 10.

Hereinafter, description will be given of an embodiment of the present disclosure with reference to the drawings. FIG. 1 is a schematic explanatory diagram of a mounting system 10. The mounting system 10 of the present embodiment is provided with a mounting device 11 which carries out a mounting process of components such as the light emitting component 75 which is described later onto the board 70, and a management computer 80 which performs the management and setting of information related to the mounting process. Note that, in the present embodiment, the left-right direction (an X-axis), the front-rear direction (a Y-axis), and the vertical direction (a Z-axis) are as illustrated in FIG. 1. The mounting process includes processes such as placing, arranging, mounting, inserting, bonding, and adhering a component onto a board.

As illustrated in FIG. 1, the mounting device 11 is provided with a conveyance section 18 which conveys the board, a collection section 21 which performs a mounting process of collecting a component and disposing the component on the board 70, a mark camera 34 which is installed on the collection section 21 and images fiducial marks of the board 70, a reel unit 56 which feeds components out from a reel 57, a parts camera 54 which images components, and a control device 60 which controls the overall device such as the collection section 21 and the mark camera 34.

The conveyance section 18 is provided with the supporting boards 20 and 20 which are provided to leave a front-rear interval in FIG. 1 and which extend in the left-right direction, and conveyor belts 22 and 22 which are provided on mutually facing surfaces of both the supporting boards 20 and 20. The conveyor belts 22 and 22 bridge across a drive wheel and a driven wheel which are provided on the left and right of the supporting boards 20 and 20 so as to be endless. The board 70 is placed on the upper surfaces of the pair of conveyor belts 22 and 22 and is conveyed from the left to the right. The board 70 is supported by support pins 23, a multitude of which are provided to stand, from the reverse surface side.

The collection section 21 is provided with a mounting head 24, an X-axis slider 26, a Y-axis slider 30, and the like. The mounting head 24 is attached to the front surface of the X-axis slider 26. The X-axis slider 26 is attached to the front surface of the Y-axis slider 30 which is capable of sliding in the front-rear direction such that the X-axis slider 26 is capable of sliding in the left-right direction. The Y-axis slider 30 is attached to a pair of guide rails 32 and 32 which are provided on the left and right to extend in the front-rear direction such that the Y-axis slider 30 is capable of sliding. Note that, the guide rails 32 and 32 are fixed to the inner portion of the mounting device 11. A pair of guide rails 28 and 28 which are provided on the top and bottom to extend in the left-right direction are provided on the front surface of the Y-axis slider 30, and the X-axis slider 26 is attached to the guide rails 28 and 28 to be capable of sliding in the left-right directions. The mounting head 24 moves in the left-right direction together with the movement of the X-axis slider 26 in the left-right direction, and moves in the front-rear direction together with the movement of the Y-axis slider 30 in the front-rear direction. Each of the sliders 26 and 30 is driven by a corresponding driving motor which is not illustrated.

The mounting head 24 is provided with nozzles 40 which suck and collect components, and a nozzle holding body 42 which is capable of mounting and removing one or more of the nozzles 40. In the present embodiment, the nozzle holding body 42 is provided with 12 nozzle holders, and is capable of mounting 12 of the nozzles 40. The nozzle holding body 42 is held by the mounting head 24 in a state capable of rotating. The nozzle 40 uses pressure to suck a component to the nozzle tip, to release a component which is sucked by the nozzle tip, and the like. The nozzle 40 is lifted and lowered in the Z-axis direction (vertical direction) which orthogonally intersect the X-axis and Y-axis directions by a holder lifting and lowering device which uses a Z-axis motor 45 as a driving source. The mounting head 24 sucks and holds the components using the nozzles 40; however, is not particularly limited thereto as long as it is possible to hold a component. For example, the mounting head 24 may be provided with a mechanical chuck which grips and holds a component.

The mark camera 34 is a device which images the board 70 from above, and is installed on the lower surface of the X-axis slider 26. The mark camera 34 is a camera, below which is an imaging region, and which reads fiducial marks which are on the board 70 indicating a reference position of the board 70, a reference position at which to dispose a component, or the like. The mark camera 34 moves in the X-Y directions together with the movement of the mounting head 24.

The reel unit 56 is provided with a plurality of the reels 57, and is attached to be attachable and detachable to the front side of the mounting device 11, and a tape in which the components are stored is wound onto the reel 57. The tape is unwound from the reel 57, and is fed out by a feeder section 58 at the collection position at which collection is performed by the mounting head 24. A plurality of the feeder sections 58 are installed corresponding to the number of the reels 57 which may be attached to or detached from the mounting device 11.

The parts camera 54 is disposed on the front of the supporting board 20 of the front side of the conveyance section 18. The imaging range of the parts camera 54 is above the parts camera 54. When the nozzle 40 which sucks the component passes over the parts camera 54, the parts camera 54 images the state of the component which is sucked by the nozzle 40, and outputs the image to the control device 60.

As illustrated in FIG. 1, the control device 60 is configured as a microprocessor centered on a CPU 61, is provided with a ROM 62 which stores process programs, a RAM 63 which is used as a working region, the HDD 64 which stores various data, an input and output interface 65 for performing transactions of electrical signals with an external device, and the like, and these are electrically connected via a bus 66. The control device 60 is connected to be capable of bidirectional communication with the conveyance section 18, the collection section 21, the mark camera 34, the parts camera 54, the reel unit 56, and the like, and receives input of image signals from the mark camera 34 and the parts camera 54. The sliders 26 and 30 are equipped with position sensors which are not illustrated, and the control device 60 controls the driving motors of the sliders 26 and 30 while receiving input of positional information from the position sensors.

The management computer 80 is a PC which manages the information relating to the mounting process, and is provided with an input device 87 such as a mouse and keyboard, a display 88, and the like. In an HDD which is not illustrated of the management computer 80, the production job data which includes the mounting information 67 which is described later is stored in an HDD which is not illustrated. In addition to the mounting information 67, the production job data includes information such as the information indicating how many of the board 70 to which components are to be mounted to manufacture, and the position of the fiducial marks of the board 70.

Figure 2:
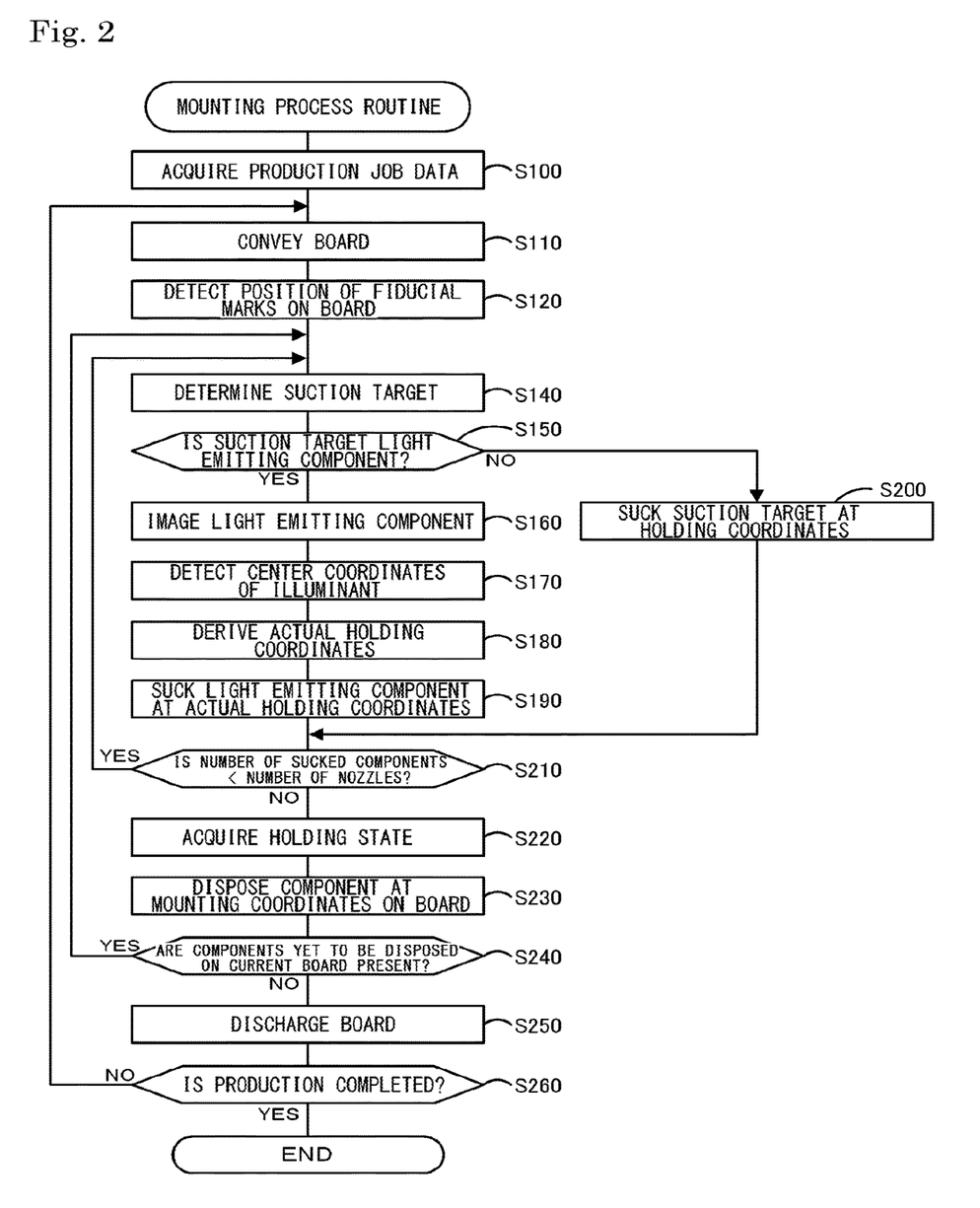
FIG. 2 is a flowchart illustrating an example of a mounting process routine.

Next, description will be given of the operation of the mounting system 10 of the present embodiment which is configured in this manner, in particular, of the mounting process in which the mounting device 11 mounts various components onto the board 70. FIG. 2 is a flowchart illustrating an example of a mounting process routine which is executed by the CPU 61 of the control device 60. This routine is stored on the HDD 64 of the mounting device 11 and is executed by a start instruction performed by a worker. When the routine is started, the CPU 61 of the control device 60 acquires the production job data which includes the mounting information 67 from the management computer 80 and stores the production job data in the HDD 64 (step S100). The CPU 61 may receive the production job data from the management computer 80 in advance and store the production job data in the HDD 64.

Figure 3:
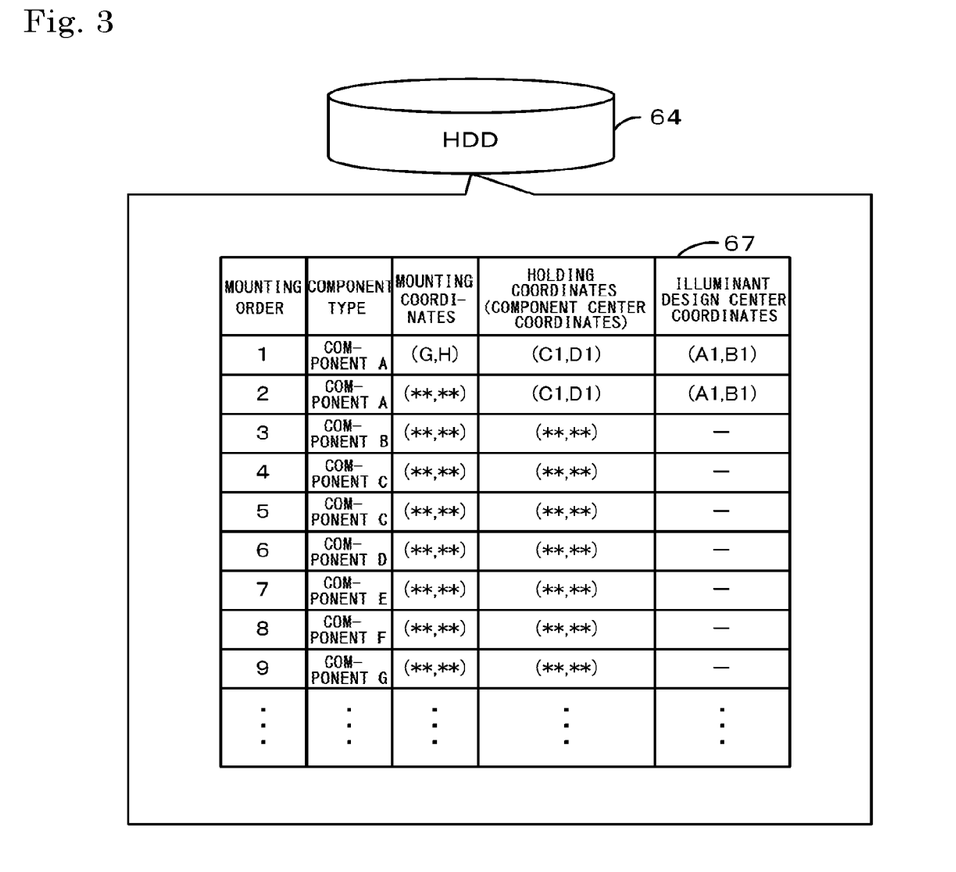
FIG. 3 is an explanatory diagram of mounting information 67 which is stored in an HDD 64.

FIG. 3 is an explanatory diagram of the mounting information 67 which is stored in the HDD 64. As illustrated, information in which the mounting order, the component type, the mounting coordinates, the holding coordinates, and the like of the components to be mounted onto the board 70 are associated is included in the mounting information 67. The mounting coordinates are coordinates (XY-coordinates) representing the position on the board 70 at which to dispose the component. The holding coordinates are coordinates (XY-coordinates) representing the position at which the component is sucked and held by. In the present embodiment, the holding coordinates are defined in advance as coordinates of the center (the center in the XY-direction) of the component.

Figure 4:
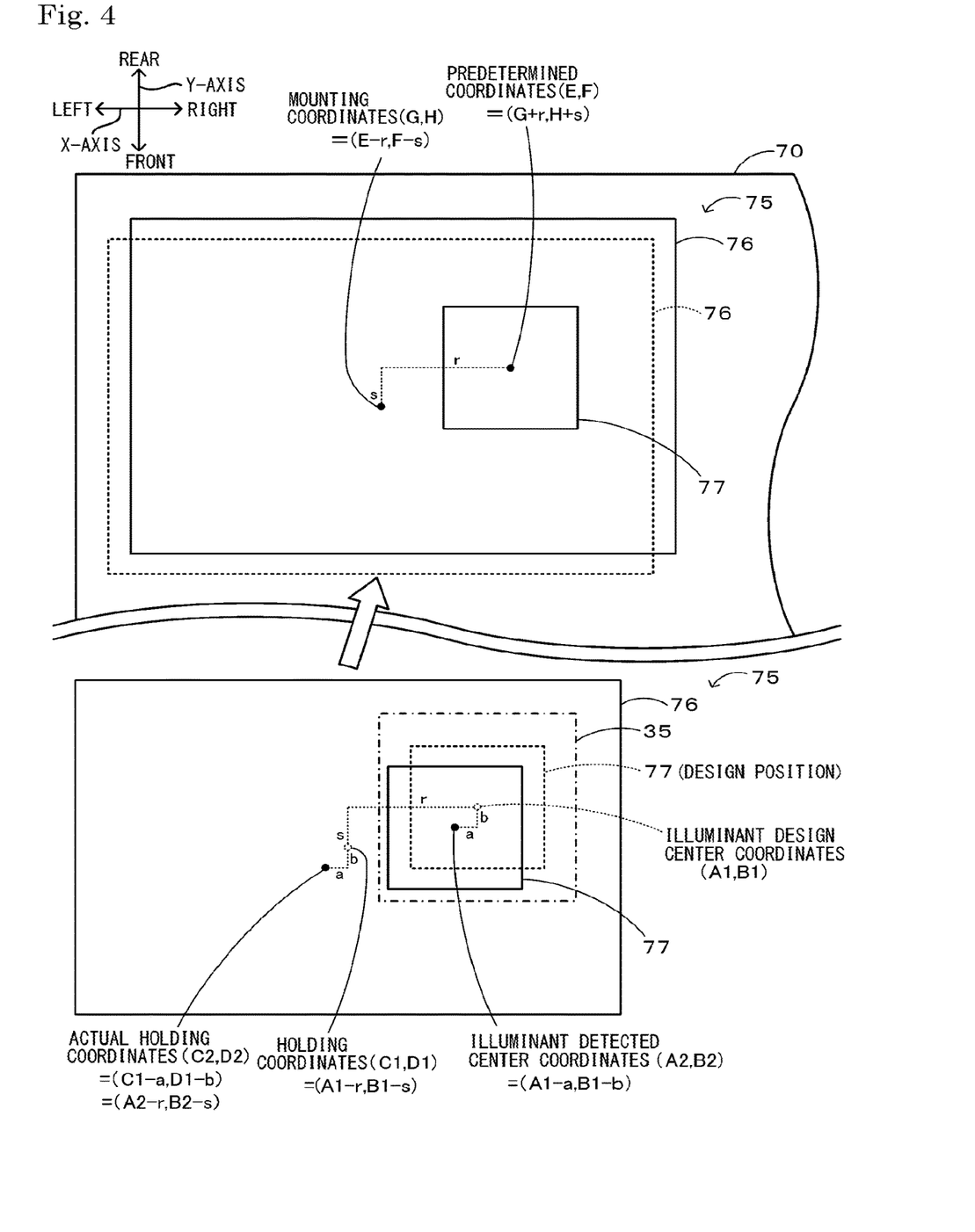
FIG. 4 is an explanatory diagram illustrating various coordinates when mounting a light emitting component 75 onto a board 70.

Here, the light emitting component 75 is included in the components which are defined to be mounted in the mounting information 67. In the present embodiment, a component A illustrated in FIG. 3 is the light emitting component 75. FIG. 4 is an explanatory diagram illustrating various coordinates when mounting the light emitting component 75 onto the board 70. As illustrated in the lower part of FIG. 4, the light emitting component 75 is provided with a support board 76, and an illuminant 77 such as an LED which is attached onto the support board 76. As illustrated in the lower part of FIG. 4, the center position of the light emitting component 75, that is, the center position (the component center coordinates) of the support board 76 is the coordinates (C1, D1). For the light emitting component 75, the design position of the illuminant 77 in the light emitting component 75 is defined in advance. As illustrated in the lower part of FIG. 4, the center position (the illuminant design center coordinates) of the illuminant 77 when the illuminant 77 is attached to the design position (when the illuminant 77 is in the dashed line position) is the coordinates (A1, B1). The holding coordinates (C1, D1) are at a position which is deviated from the illuminant design center coordinates (A1, B1) in by a coordinate r in the left direction and a coordinate s forward. To summarize, holding coordinates (C1, D1)=coordinates (A1-r, B1-s). In other words, the relative position of the holding coordinates in relation to the illuminant design center coordinates is the coordinates (-r, -s). As illustrated in FIG. 3, the coordinates (C1, D1) are included in the mounting information 67 as the holding coordinates corresponding to the component A (the light emitting component 75). The coordinates (A1, B1) are included in the mounting information 67 as the illuminant design center coordinates corresponding to the component A (the light emitting component 75). In this manner, the positional relationship between the illuminant design center coordinates which are the center of the illuminant 77 and the holding coordinates at which the mounting head 24 holds the light emitting component 75 is included in the mounting information 67. The holding coordinates and the illuminant design center coordinates are values which are defined for each type of the light emitting component 75. Therefore, as illustrated in FIG. 3, the holding coordinates and the illuminant design center coordinates corresponding to the component A are the same values for both the mounting order 1 and the mounting order 2. In the mounting information 67, the value of the illuminant design center coordinates is not associated with the components other than the light emitting component 75 (components B to G and the like).

In the present embodiment, the mounting coordinates are coordinates which use the fiducial marks of the board 70 as an origin point. The holding coordinates and the illuminant design center coordinates are coordinates which use the reference position which is stored in the HDD 64 in advance for each of the plurality of feeder sections 58 as the origin point. The holding coordinates and the illuminant design center coordinates are defined as the coordinates of the component which unwound from the reel 57 and is collected next by the mounting head 24 (the component which is fed out by the feeder section 58 to the collection position) among the plurality of components which are stored in the tape of the reel 57.

When the production job data which includes the mounting information 67 is stored, the CPU 61 causes the board 70 to be conveyed (step S110). In this process, the CPU 61 causes the board 70 to be conveyed using the conveyor belt 22 and 22 of the conveyance section 18, and causes the component to be fixed to the board 70 at a predetermined mounting position at which a placement process is performed. Next, the CPU 61 performs a process of detecting the position of the fiducial marks of the board 70 (step S120). In this process, the CPU 61 causes the mark camera 34 to move to the position of the board mark using the sliders 26 and 30 based on the production job data. Next, the CPU 61 causes the mark camera 34 to image the board mark. The CPU 61 detects the position (the XY-coordinates) of the fiducial marks based on the captured image and stores the position in the RAM 63. The CPU 61 ascertains the coordinates (for example, the mounting coordinates or the like)

on the board 70 in the following process, using the coordinates of the fiducial marks which are detected as the origin point.

Next, the CPU 61 determines a component which is yet to be disposed according to the mounting order of the mounting information 67 to be a suction target (step S140). The CPU 61 determines whether or not the suction target is the light emitting component 75 (step S150). The CPU 61 performs the determination based on the component type of the suction target in the mounting information 67, for example. The CPU 61 may perform the determination according to whether or not the illuminant design center coordinates are associated with the component which is the suction target in the mounting information 67.

When the suction target is the light emitting component 75 in step S150, the CPU 61 causes the mark camera 34 to image the illuminant 77 of the light emitting component 75 to acquire a light emitting component image (step S160). In this process, the CPU 61 first acquires the illuminant design center coordinates of the suction target which is defined in the mounting information 67 from the HDD 64. The CPU 61 causes the mark camera 34 to move such that the center of an imaging range 35 (refer to the lower part of FIG. 4) of the mark camera 34 is positioned at the illuminant design center coordinates corresponding to the feeder section 58 which feeds out the suction target. The CPU 61 acquires the light emitting component image using the mark camera 34. As illustrated in FIG. 4, the visual field, that is, the imaging range 35 of the mark camera 34 is defined in advance such that it is possible to image the entirety of the illuminant 77. The imaging range 35 is empirically defined in advance such that it is possible to image the entirety of the illuminant 77 even if the position of the illuminant 77 in the light emitting component 75 is deviated from the design value. In the present embodiment, the imaging range 35 does not have enough width to enable the imaging of the entirety of the illuminant 77 and the outer shape portion of the light emitting component 75 (for example, the end portions, corner portions, and the like of any of the front, rear, left, and right of the support board 76, for example) as a single image.

Next, the CPU 61 detects the actual coordinates (illuminant detected center coordinates) of the center of the illuminant 77 based on the acquired light emitting component image (step S170). In this process, the CPU 61 first compares the light emitting component image with a comparison image which is obtained by imaging the light emitting component 75 centered on the illuminant 77 in advance. The CPU 61 detects the region of the illuminant 77 in the light emitting component image based on the comparison results, and detects the illuminant detected center coordinates based on the center position of the detected region. Accordingly, for example, in a case in which the position of the illuminant 77 in the light emitting component 75 is according to the design value, the CPU 61 detects the same coordinates as the illuminant design center coordinates (A1, B1) as the illuminant detected coordinates. Meanwhile, in a case in which the position of the illuminant 77 in the light emitting component 75 is deviated in the left direction by the coordinate a and to the front by the coordinate b from the design value as illustrated in the lower part of FIG. 4, the CPU 61 detects the coordinates (A2, B2)=coordinates (A1−a, B1−b) as the illuminant detected coordinates. The comparison image may be included in the production job data, and may be stored in advance in the HDD 64. The embodiment is not limited to a case in which the comparison image is used, and reference information for the CPU 61 to detect the illuminant detected center coordinates based on the light emitting component image may be present. For example, a threshold for distinguishing a color difference between the pixels of the illuminant 77 and the pixels of the support board 76 in the light emitting component image may be included in the production job data as reference information.

Next, the CPU 61 derives the actual holding coordinates which are the position at which the light emitting component 75 is actually sucked based on the illuminant detected center coordinates which are detected and the holding coordinates and the illuminant design center coordinates which are included in the mounting information 67 (step S180). In this process, the CPU 61 first derives a deviation amount (the difference between both coordinates) in the XY-directions from the illuminant design center coordinates to the illuminant detected center coordinates. Next, the CPU 61 derives the coordinates which are deviated from the holding coordinates by the deviation amount as the actual holding coordinates. For example, in a case in which the position of the illuminant 77 in the light emitting component 75 is according to the design value, the illuminant design center coordinates and the illuminant detected center coordinates are the same, and the deviation amount becomes (0, 0). Therefore, the CPU 61 derives the same coordinates as the holding coordinates which are included in the mounting information 67 as the actual holding coordinates. Meanwhile, in a case in which the position of the illuminant 77 in the light emitting component 75 is deviated from the design value as illustrated in the lower part of FIG. 4, the deviation amount from the illuminant design center coordinates (A1, B1) to the illuminant detected center coordinates (A2, B2) becomes (−a, −b). Therefore, the CPU 61 derives coordinates (C2, D2)=(C1−a, D1−b), which are deviated by the deviation amount (−a, −b) from the holding coordinates (C1, D1) which are included in the mounting information 67, as the actual holding coordinates. As can be understood from FIG. 4, the actual holding coordinates (C2, D2) are coordinates (A2−r, B2−s) which are deviated in the left direction by a coordinate r, and to the front by a coordinate s from the illuminant detected center coordinates (A2, B2). Accordingly, as can be understood from FIG. 4, the positional relationship between the illuminant detected center coordinates (A2, B2) and the actual holding coordinates (C2, D2) in a case in which the position of the illuminant 77 is deviated from the design value is the same as the positional relationship between the illuminant design center coordinates (A1, B1) and the holding coordinates (C1, D1) in a case in which the position of the illuminant 77 is according to the design value. In other words, the positional relationship between the illuminant detected center coordinates (A2, B2) and the actual holding coordinates (C2, D2) is not influenced by the deviation amount (−a, −b) from the illuminant design center coordinates (A1, B1) to the illuminant detected center coordinates (A2, B2). In this manner, the CPU 61 derives the actual holding coordinates such that the positional relationship between the illuminant detected center coordinates and the actual holding coordinates is always the same regardless of the deviation amount of the position of the illuminant 77 from the design value. The CPU 61 causes the mounting head 24 to move such that the tip of the nozzle 40 is positioned at the actual holding coordinates, and the light emitting component 75 is sucked and held by at the actual holding coordinates (step S190). In this manner, when the CPU 61 causes the mounting head 24 to hold the light emitting component 75, the CPU 61 causes the mounting head 24 to hold the light emitting component 75 at the actual holding coordinates which are derived based on the illuminant detected center coordinates instead of at the holding coordinates which are specified in the mounting information 67. Meanwhile, when the suction target is not the light emitting component 75 in step S150, the CPU 61 causes the mounting head 24 to move such that the tip of the nozzle 40 is positioned at the holding coordinates which is specified by the mounting information 67, and sucks and holds the component which is the suction target at the holding coordinates (step S200).

When the suction target is sucked in step S190 or step S200, the CPU 61 determines whether or not the number of components which are sucked by the mounting head 24 is less than the number (12) of the nozzles 40 of the nozzle holding body 42 (step S210). When the number of sucked components is less than the number of the nozzles 40 of the nozzle holding body 42 in step S210, the CPU 61 performs the processes of step S140 onward. In other words, the CPU 61 sequentially sets the suction target, if the suction target is the light emitting component 75, causes the component to be sucked at the actual holding coordinates using the nozzle 40, and if the suction target is a component other than the light emitting component 75, causes the component to be sucked at the holding coordinates using the nozzle 40. In step S210, when the number of sucked components is not less than the number of nozzles 40 of the nozzle holding body 42, that is, when all 12 of the nozzles 40 of the nozzle holding body 42 suck and hold the components, the CPU 61 acquires the holding state of the components which are held by the nozzles 40 (step S220). In this process, the CPU 61 causes the mounting head 24 to move to the top portion of the parts camera 54, and acquires an image which is captured by the parts camera 54. The CPU 61 analyzes the image and determines the presence or absence of abnormalities in the components, abnormalities relating to the posture of the inclination or the like of the component, deviation in the holding position, and the like. The CPU 61 causes components which have abnormalities to be discarded. In the present embodiment, the CPU 61 omits the determination of the presence or absence of abnormalities for the light emitting components 75. When all of the components which are held by the nozzle 40 of the nozzle holding body 42 are the light emitting components 75, the CPU 61 does not perform the imaging using the parts camera 54 and omits the process itself of step S220. However, the CPU 61 may not perform the omission.

Next, the CPU 61 causes the component which is held by the mounting head 24 to be disposed (mounted) at the mounting coordinates on the board 70 (step S230). In this process, the CPU 61 causes the mounting head 24 to move to ensure that the tip of the nozzle 40 which is holding the component is positioned at the mounting coordinates, and causes the Z-axis motor 45 to lower the component to dispose the component at the mounting coordinates. In other words, the CPU 61 performs movement and disposition of the component onto the board 70 such that the portion which holds the component is disposed at the mounting coordinates. The CPU 61 causes the plurality of components which are held by the mounting head 24 to be sequentially disposed at the mounting coordinates according to the mounting order of the mounting information 67.

Here, description will be given of a case in which the light emitting component 75 is disposed at the mounting coordinates using FIG. 4. As described above, even if the position of the illuminant 77 in the light emitting component is deviated from the design value, the positional relationship between the actual holding coordinates and the illuminant detected center coordinates of the light emitting component 75 is the same. Therefore, as illustrated in FIG. 4, when the CPU 61 disposes the portion which holds the light emitting component 75 (the portion corresponding to the actual holding coordinates (C2, D2) during the suction) at the mounting coordinates (G, H), the center of the illuminant 77 is positioned at predetermined coordinates (E, F)=coordinates (G+r, H+s). In this manner, in the present embodiment, due to the CPU 61 holding the light emitting component 75 at the actual holding coordinates and disposing the light emitting component 75 at the mounting coordinates, the center of the illuminant 77 is disposed at the predetermined coordinates regardless of the positional deviation from the design value of the illuminant 77. The predetermined coordinates are a predetermined position on the board 70 at which the center of the illuminant 77 is to be disposed. In other words, the mounting coordinates which are included in the mounting information 67 are defined in advance by performing an inverse operation from the predetermined coordinates as coordinates at which the positional relationship between the predetermined coordinates and the mounting coordinates becomes the same as the positional relationship between the illuminant design center coordinates and the holding coordinates. The position of the support board 76 in the light emitting component 75 changes according to the positional deviation from the design value of the illuminant 77 in the light emitting component 75. In the upper part of FIG. 4, the position of the support board 76 on the board 70 after the mounting in a case in which the position of the illuminant 77 is according to the design value is illustrated using a dashed line. The position of the support board 76 on the board 70 after the mounting in a case in which the illuminant detected center coordinates of the illuminant 77 are the coordinates (A2, B2) is illustrated using a solid line.

In step S230, when all of the components which are held by the mounting head 24 are disposed on the board 70, the CPU 61 determines whether or not there is currently a component which is yet to be disposed on the board 70 based on the mounting information 67 (step S240), and executes the processes of step S130 onward when there is a component which is yet to be mounted. In other words, the CPU 61 causes the nozzle 40 to be changed as necessary, and if the suction target is the light emitting component 75, holds the suction target at the actual holding coordinates, and if the suction target is a component other than the light emitting component 75, holds the suction target at the holding coordinates, and disposes the component which is held at the mounting coordinates. Meanwhile, when there is currently no component which is yet to be disposed on the board 70, the CPU 61 causes the current board 70 for which the mounting is completed to be discharged (step S250), and determines whether or not the production is completed based on the number of boards for which the mounting is completed (step S260). When the production is not completed, the CPU 61 repeatedly executes the processes of step S110 onward. Meanwhile, when the production is completed, the CPU 61 ends the routine.

Here, the correspondence between the constituent elements of the present embodiment and the constituent elements of the present disclosure will be rendered clear. The mounting head 24 of the present embodiment corresponds to the component holding means of the present disclosure, the X-axis slider 26 and the Y-axis slider 30 correspond to the moving means, the mark camera 34 corresponds to the imaging means, and the CPU 61 corresponds to the illuminant coordinates detection means and the control means. The HDD 64 corresponds to the positional relationship storage means and the mounting coordinates storage means.

According to the mounting system 10 which is described above, the CPU 61 causes a region which includes at least a portion of the illuminant 77 of the light emitting component 75 to be imaged and acquires the light emitting component image when mounting the light emitting component 75 which includes the illuminant 77 onto the board 70. Next, the CPU 61 detects the coordinates (the illuminant detected center coordinates) of the specific part (the center) of the illuminant 77 based on the light emitting component image. The CPU 61 controls the mounting head 24, the X-axis slider 26, and the Y-axis slider 30 to mount the light emitting component 75 such that the light emitting component 75 is held, the light emitting component 75 is moved to above the board 70, and the center of the illuminant 77 is positioned at predetermined coordinates on the board 70 based on the illuminant detected center coordinates, without using the information relating to the outer shape of the light emitting component 75 which is based on the light emitting component image. In this manner, the CPU 61 performs the mounting using the illuminant detected center coordinates as a reference instead of the coordinates of the light emitting component 75. Therefore, even if the position of the illuminant 77 in the light emitting component is deviated from the design value, it is possible to accurately position the illuminant 77 on the board 70. It is possible to position the illuminant 77 without using the information relating to the outer shape of the light emitting component 75 which is based on a light emitting component image. After mounting the light emitting component 75 onto the board 70, there is a case in which a lens component or the like is placed over the illuminant 77. At this time, there is a case in which when the positional relationship between the lens component and the illuminant 77 is deviated, the desired luminance may not be obtained. There is a case in which it may not be possible to change the position of the lens component on the board 70 according to the position of the illuminant 77 such as a case in which a portion of the lens component is inserted into a hole which is opened in the board 70 and the lens component is fixed. Even this case, in the mounting device 11, it becomes easier to obtain the desired luminance in order for the CPU 61 to accurately position the center of the illuminant 77 at predetermined coordinates regardless of the positional deviation of the illuminant 77 in the light emitting component 75. In the explanation which uses FIG. 4, a case is exemplified in which the position of the illuminant 77 in the light emitting component 75 is deviated from the design value; however, even in a case in which the position of the entirety of the light emitting component 75 which is collected by the mounting head 24 is deviated, it is possible to accurately position the illuminant 77 on the board 70 in the same manner due to the CPU 61 performing the process described above. In other words, in the embodiment described above, the CPU 61 performs the mounting using the illuminant detected center coordinates as a reference instead of the coordinates of the light emitting component 75, and thus, it is possible to accurately position the illuminant 77 on the board 70 without particularly distinguishing which of positional deviation of the illuminant 77 caused by positional deviation of the entirety of the light emitting component 75 and positional deviation of the illuminant 77 in the light emitting component 75 is occurring. Even in a case in which both the positional deviation of the entirety of the light emitting component 75 and the positional deviation of the illuminant 77 in the light emitting component 75 are occurring, it is possible for the CPU 61 to accurately position the illuminant 77 on the board 70 in the same manner. Examples of cases in which the position of the entirety of the light emitting component 75 is deviated include a case in which the position of the light emitting component 75 in the tape is deviated, for example, and a case in which deviation occurs in the tape feeding by the feeder section 58.

The mounting information 67 which includes the mounting coordinates on the board 70 which is in the same positional relationship as the positional relationship between the illuminant design center coordinates and the holding coordinates of the illuminant 77, or the positional relationship between the illuminant design center coordinates and the holding coordinates in relation to the predetermined coordinates on the board 70 is stored in the HDD 64. The CPU 61 derives the actual holding coordinates which are in the same positional relationship in relation to the illuminant detected center coordinates based on the illuminant detected center coordinates and the positional relationship which is stored, causes the light emitting component 75 to be held at the actual holding coordinates, and disposes the held portion at the mounting coordinates. In this manner, the CPU 61 defines the actual holding coordinates using the illuminant detected center coordinates as a reference. Therefore, even if the position of the illuminant 77 in the light emitting component 75 is deviated from the design value, the positional relationship between the center of the illuminant 77 and the portion which is held in the light emitting component 75 is always fixed. Accordingly, the CPU 61 is capable of accurately positioning the center of the illuminant 77 at predetermined coordinates on the board 70 by simply positioning the portion of the light emitting component 75 which is held by the mounting head 24 at the mounting coordinates which are stored in advance.

The positional relationship which is stored in the HDD 64 is the positional relationship between the illuminant design center coordinates and the holding coordinates. Therefore, in a case in which the position of the illuminant 77 in the light emitting component 75 is according to the design value, the center position of the light emitting component 75 becomes the actual holding coordinates. In a case in which the position of the illuminant 77 is deviated from the design value, a position which is deviated from the center position of the light emitting component 75 by the amount becomes the actual holding coordinates. In other words, a position which corresponds to the positional deviation of the illuminant 77 using the center position of the light emitting component 75 as a reference becomes the actual holding coordinates. Therefore, in comparison to a case in which the actual holding coordinates are defined using the vicinity of the end portion of the light emitting component 75 as a reference (the holding coordinates), for example, the actual holding coordinates are deviated from the light emitting component 75, and it becomes difficult for a state to arise in which the light emitting component 75 may not be held.

Since the mark camera 34 also serves as the imaging means for imaging the light emitting component 75, it is possible to reduce the number of components of the mounting device 11. In the mark camera 34, there is a case in which the visual field is narrow, and the illuminant 77 and the outer shape portion of the light emitting component 75 may not be imaged as a single image. In other words, there is a case in which an image, from which it is possible to acquire both the illuminant detected center coordinates and information relating to the outer shape of the light emitting component 75, may not be captured. Therefore, there is a great meaning to applying the present disclosure which does not use the information relating to the outer shape of the light emitting component 75 which is based on the light emitting component image.

It goes without saying that the present disclosure is not limited in any manner by the embodiment described above, and may be carried out in any of various modes which fall within the technical scope of the present disclosure.

Figure 5:
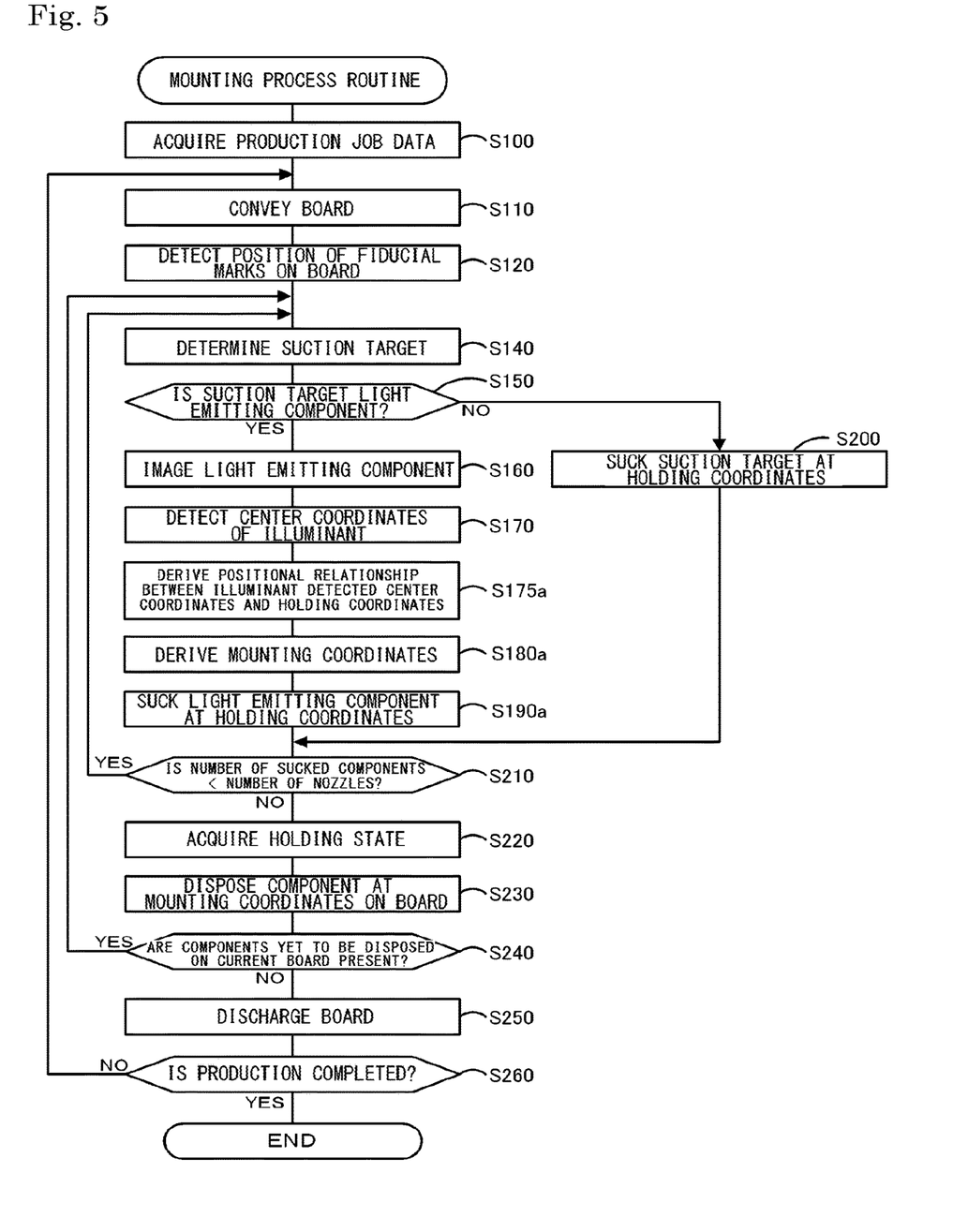
FIG. 5 is a flowchart illustrating an example of a mounting process routine of an alternative embodiment.
Figure 6:
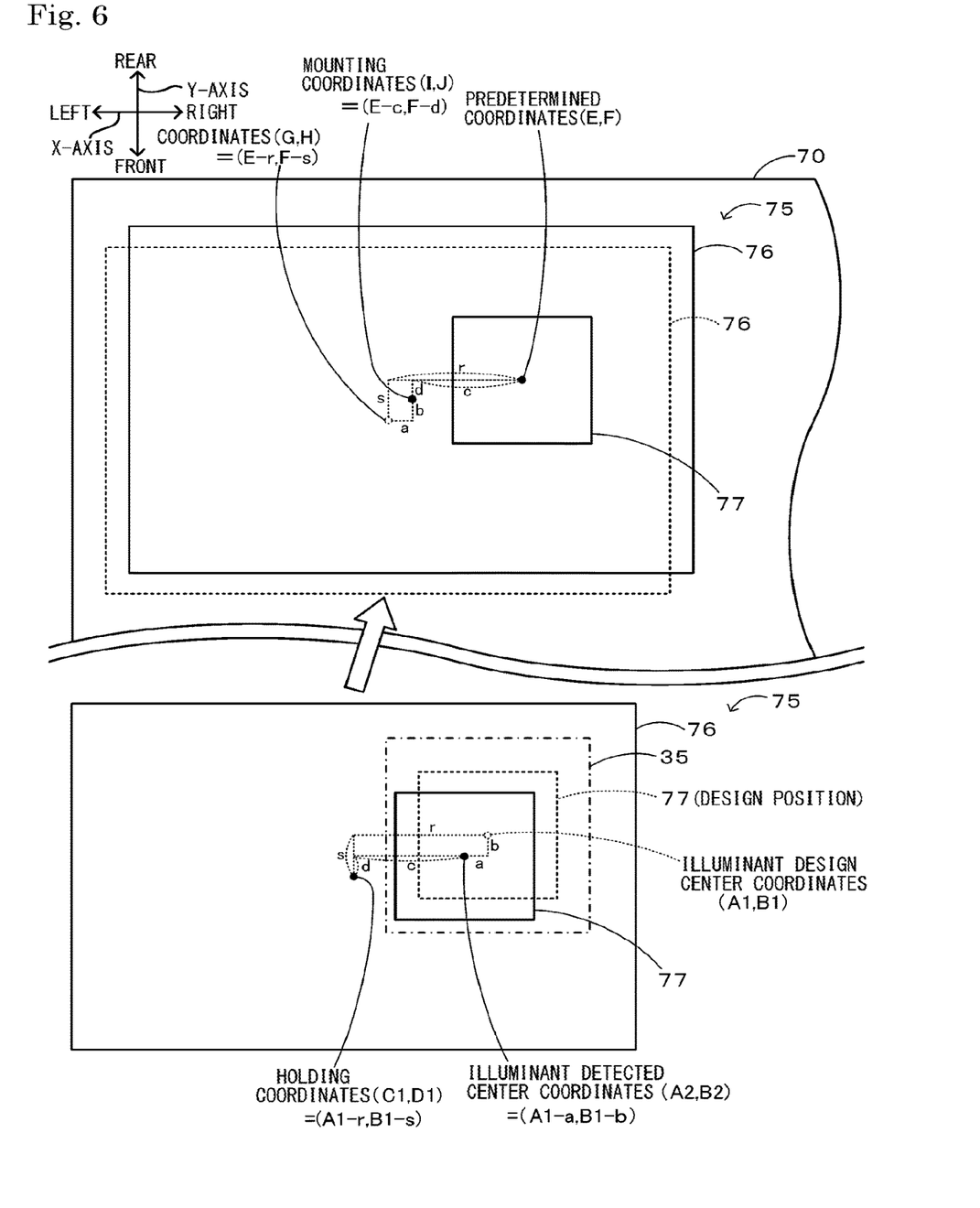
FIG. 6 is an explanatory diagram illustrating various coordinates when mounting the light emitting component 75 onto the board 70.

For example, in the embodiment described above, the CPU derives the actual holding coordinates based on the illuminant detected center coordinates, holds the light emitting component 75 at the actual holding coordinates, and disposes the portion which is held at the mounting coordinates; however, the configuration is not limited thereto. The mounting device 11 may perform the mounting such that the center of the light emitting component 75 is disposed at predetermined coordinates on the board 70 based on the illuminant detected center coordinates which are detected from the illuminant image. For example, the CPU 61 may control the mounting head 24 to hold the light emitting component 75 at the holding coordinates without deriving the actual holding coordinates regardless of the illuminant detected center coordinates, and may derive the mounting coordinates based on the illuminant detected center coordinates. FIG. 5 is a flowchart illustrating an example of a mounting process routine of the alternative embodiment. The routine is the same as the mounting process routine of FIG. 2 except for in that steps S175a to S190a are performed instead of steps S180 to S190 which are described above. In a case in which the mounting process routine of the alternative embodiment is performed, the predetermined coordinates (desired coordinates on the board 70 at which the center of the illuminant 77 is to be disposed) described above are associated with the light emitting component 75 instead of the mounting coordinates in the mounting information 67 which is stored in the HDD 64 in step S100. In the mounting process routine of the alternative embodiment, the CPU 61 detects the illuminant detected center coordinates based on the light emitting component image in step S170, and subsequently derives the positional relationship between the illuminant detected center coordinates and the holding coordinates which are associated with the light emitting component 75 which is the suction target in the mounting information 67 (step S175a). Description will be given of the positional relationship which is derived by the CPU 61 using FIG. 6. For example, in a case in which the position of the illuminant 77 in the light emitting component 75 is according to the design value, the CPU 61 derives the relative coordinates (−r, −s) of the holding coordinates (C1, D1) which use the illuminant detected center coordinates (=the illuminant design center coordinates) (A1, B1) as a reference (an origin point) as the positional relationship between the illuminant detected center coordinates and the holding coordinates. Meanwhile, in a case in which the position of the illuminant 77 in the light emitting component 75 is at coordinates (A2, B2) which are deviated from the design value as illustrated in the lower part of FIG. 6, the CPU 61 derives the relative coordinates (−c, −d)=the relative coordinates (−r+a, −s+b) of the holding coordinates (C1, D1) which use the illuminant detected center coordinates (A2, B2) as an origin point as the positional relationship between the illuminant detected center coordinates and the holding coordinates. In this manner, a positional relationship which corresponds to the illuminant detected center coordinates is derived. Next, the CPU 61 derives the mounting coordinates based on the positional relationship which is derived and the predetermined coordinates which are stored in the mounting information 67 (step S180a). The CPU 61 derives the mounting coordinates such that the position of the mounting coordinates which use the predetermined coordinates as a reference becomes the same as the position of the holding coordinates which use the illuminant detected center coordinates as a reference. For example, in FIG. 6, in a case in which the position of the illuminant 77 in the light emitting component 75 is according to the design value, the CPU 61 derives the coordinates (G, H)=the coordinates (E−r, F−s) which are in the position of the relative coordinates (−r, −s), which use the predetermined coordinates (E, F) as a reference, as the mounting coordinates. Meanwhile, in FIG. 6, in a case in which the illuminant detected center coordinates are the coordinates (A2, B2), the CPU 61 derives the coordinates (I, J)=the coordinates (E−c, F−d) which are in the position of the relative coordinates (−c, −d), which use the predetermined coordinates (E, F) as a reference, as the mounting coordinates. The CPU 61 causes the mounting head 24 to move, suck and hold the light emitting component 75 at the holding coordinates (step S190a), and performs the processes of step S210 onward. After step S220, the CPU 61 disposes (mounts) the component which is held by the mounting head 24 at the mounting coordinates on the board 70 (step S230). In this manner, in the mounting device 11 of the alternative embodiment, the CPU 61 derives the mounting coordinates as the coordinates of the movement destination of the light emitting component 75 which is held at the holding coordinates at which it is possible to dispose the illuminant detected center coordinates at the predetermined coordinates based on the positional relationship between the illuminant detected center coordinates and the holding coordinates. Accordingly, even if the position of the illuminant 77 in the light emitting component 75 is deviated from the design value, it is possible to accurately position the center of the illuminant 77 at the predetermined coordinates (E, F) on the board 70. In the mounting device 11 of the alternative embodiment, the illuminant design center coordinates which are included in the mounting information 67 are merely the coordinates which indicate the imaging position when imaging the light emitting component 75 in step S160. Therefore, even in a case in which the illuminant detected center coordinates are detected from the light emitting component image, other coordinates may be included in the mounting information 67 instead of the illuminant design center coordinates. In the mounting device 11 of the alternative embodiment which is described above, the predetermined coordinates are included in the mounting information 67; however, the configuration is not limited thereto. For example, in a case in which, instead of the predetermined coordinates, the position of the illuminant 77 in the light emitting component 75 is according to the design value, the mounting coordinates and the positional relationship (the positional relationship between the illuminant design center coordinates and the holding coordinates) may be included in the mounting information 67. In this case, the CPU 61 may derive the deviation amount between the positional relationship which is derived in step S175a and the positional relationship which is included in the mounting information 67, and may derive post-correction mounting coordinates, which serve as coordinates which are obtained by deviating the mounting coordinates which are included in the mounting information 67 by the deviation amount which is derived, in step S180a. In step S230, the CPU 61 may dispose (mount) the light emitting component 75 which is held by the mounting head 24 at the post-correction mounting coordinates on the board 70. Even in this case, it is possible to accurately position the center of the illuminant 77 at the predetermined coordinates (E, F) on the board 70.

In the embodiment which is described above, the illuminant design center coordinates and the holding coordinates are included in the mounting information 67 as the positional relationship between the illuminant design center coordinates and the holding coordinates of the illuminant 77; however, as long as the information represents the positional relationship between the two, the configuration is not limited thereto. For example, relative coordinates which represent the position of the other coordinates when the coordinates of one of the illuminant design center coordinates and the holding coordinates are used as a reference may be included in the mounting information 67 as the information which represents the positional relationship. Even in this case, the CPU 61 is capable of deriving the actual holding coordinates based on the positional relationship between the illuminant detected center coordinates and the mounting information 67.

In the embodiment described above, the CPU 61 detects the illuminant detected center coordinates which are the center coordinates of the illuminant 77 based on the light emitting component image; however, the configuration is not limited thereto, and the CPU 61 may detect the coordinates of a specific part of the illuminant 77. For example, the CPU 61 may detect the coordinates of the end portion, the corner portion, or the like of one of the front, back, left, and right of the illuminant 77. Alternatively, the CPU 61 may detect the coordinates of a predetermined mark or the like which is arranged on the illuminant 77. The light emitting component image is an image which includes the entirety of the illuminant 77; however, the configuration is not limited thereto. The imaging range 35 may be defined such that a region which is necessary for detecting the coordinates of the specific part of the illuminant 77 is included in the light emitting component image. The CPU 61 may detect the coordinates of a plurality of specific parts of the illuminant 77 such as detecting the coordinates of the center and the coordinates of a corner portion of the illuminant 77.

In the embodiment described above, in step S180, the CPU 61 derives coordinates which are deviated from the holding coordinates by the deviation amount in the XY-directions from the illuminant design center coordinates to the illuminant detected center coordinates as the actual holding coordinates. In other words, the CPU 61 derives the actual holding coordinates in consideration of the XY-directional deviation of the illuminant 77. At this time, the CPU 61 may derive the actual holding coordinates also in consideration of the inclination (rotational direction deviation) in the XY-plane of the illuminant 77. For example, the mounting device 11 may store the mounting information 67 which includes the positional relationships between the coordinates of plurality of specific parts of the illuminant 77 and the holding coordinates, and the mounting coordinates on the board 70 which is in the same positional relationship as the positional relationship between the coordinates of the plurality of specific parts and the holding coordinates in relation to a plurality of predetermined coordinates on the board 70 in the HDD 64. The CPU 61 may derive the actual holding coordinates which are in the same positional relationship as the positional relationship which is stored in relation to the coordinates of a plurality of specific parts which are detected based on the coordinates of a plurality of specific parts which are detected from the light emitting component image and the positional relationship which is stored, and may hold the light emitting component 75 at the actual holding coordinates and control the mounting head 24, the X-axis slider 26, and the Y-axis slider 30 such that the held portion is disposed at the mounting coordinates.

Specifically, in steps S100, S170, and S180 of the embodiment which is described above, for example, the CPU 61 may perform the following processes. In step S100, the CPU 61 acquires the production job data which includes the mounting information 67 which includes the coordinates (for example, the coordinates of the center of the illuminant 77 and the coordinates of the front left corner portion of the illuminant 77 of a case in which the position of the illuminant 77 is according to the design value) of the plurality of specific parts of the illuminant 77, the holding coordinates, and the mounting coordinates, and stores the production job data in the HDD 64. In step S170, the CPU 61 detects the coordinates of the plurality of specific parts (for example, the center and the front left corner portion) within the illuminant 77 based on the light emitting component image. The CPU 61 derives the deviation amount (the rotational angle) of the rotational direction of the illuminant 77 which is compares to a case in which the position of the illuminant 77 is according to the design value based on the coordinates of the plurality of specific parts which are detected, and the coordinates of the plurality of specific parts which are stored in the HDD 64. For example, the CPU 61 derives an angle formed by a segment of a line which joins the coordinates of the plurality of specific parts which are stored in the HDD 64 and a segment of a line which joins the coordinates of the plurality of specific parts which are detected as the deviation amount of the rotational direction. Next, in step S180, the CPU 61 derives the actual holding coordinates which are in the same positional relationship as the positional relationship which is stored in the HDD 64 in relation to the coordinates of the plurality of specific parts which are detected. In other words, the actual holding coordinates are derived as coordinates at which the positional relationship between the coordinates of the plurality of specific parts which are stored in the HDD 64 and the holding coordinates, becomes the same as the positional relationship between the coordinates of the plurality of specific parts which are detected and the actual holding coordinates. The CPU 61 causes the light emitting component 75 to be sucked and held at the actual holding coordinates in step S190, and disposes (mounts) the light emitting component 75 at the mounting coordinates on the board 70 in step S230. At this time, the CPU 61 causes the light emitting component 75 to be disposed (mounted) at the mounting coordinates on the board 70 after rotating the light emitting component 75 by the deviation amount of the rotational direction so as to correct the deviation amount of the rotational direction which is derived in step S170. By doing so, even in a case in which the illuminant 77 is deviated in the rotational direction in addition to a case in which the illuminant 77 is deviated in the XY-directions, the CPU 91 is capable of accurately positioning the illuminant 77 on the board 70 also including the inclination (the positioning angle) of the illuminant 77. Even in the mounting process routine of the alternative embodiment which is illustrated in FIG. 5, by using the coordinates of the plurality of specific parts of the illuminant 77, it is possible to accurately position the illuminant 77 on the board 70 also in consideration of the deviation in the rotational direction of the illuminant 77 in the same manner. Specifically, after detecting the coordinates (for example, the coordinates of the center and the front left corner portion) of the plurality of specific parts of the illuminant 77 based on the light emitting component image in step S170, the CPU 61 derives the positional relationship between the coordinates which are detected and the holding coordinates which are associated with the light emitting component 75 which is the suction target in the mounting information 67 in step S175a. In step S180a, the CPU 61 derives the mounting coordinates based on the positional relationship which is derived and the plurality of predetermined coordinates (for example, the desired coordinates on the board 70 at which the center and the front left corner portion of the illuminant 77 are to be disposed) which are stored in advance as the mounting information 67. In other words, the CPU 61 derives the mounting coordinates such that the position of the mounting coordinates which use the plurality of predetermined coordinates as a reference becomes the same as the position of the holding coordinates which use the coordinates of the plurality of specific parts which are detected as a reference. The CPU 61 derives an angle formed by a segment of a line which joins the plurality of predetermined coordinates which are stored in the HDD 64 and a segment of a line which joins the coordinates of the plurality of specific parts which are detected as the deviation amount of the rotational direction of the illuminant 77. The CPU 61 causes the light emitting component 75 to be sucked and held at the actual holding coordinates in step S190a, and disposes (mounts) the light emitting component 75 at the mounting coordinates on the board 70 in step S230. At this time, the CPU 61 causes the light emitting component 75 to be disposed (mounted) at the mounting coordinates on the board 70 after rotating the light emitting component 75 by the deviation amount of the rotational direction so as to correct the deviation amount of the rotational direction which is derived in step S180a.

In the embodiment described above, the imaging range 35 does not have enough width to enable the imaging of the entirety of the illuminant 77 and the outer shape portion of the light emitting component 75 as a single image; however, the configuration is not limited thereto. In the mounting device 11, the mark camera 34 also functions as the imaging means for imaging the light emitting component 75; however, the configuration is not limited thereto, and a separate imaging means from the mark camera 34 may image the light emitting component image.

In the embodiment described above, the holding coordinates which are included in the mounting information 67 are set to the coordinates of the center of the light emitting component 75; however, the configuration is not limited thereto, and the coordinates of any portion in the light emitting component 75 may be used. However, since a state in which the actual holding coordinates become separated from the light emitting component 75 and the light emitting component 75 may not be held does not occur easily, it is preferable to use the coordinates of the center of the light emitting component 75 as the holding coordinates.

In the embodiment described above, the mounting coordinates are coordinates which use the fiducial marks of the board 70 as an origin point, and the holding coordinates and the illuminant design center coordinates are coordinates which use the reference position which is stored in the HDD 64 in advance corresponding to each of the plurality of feeder sections 58 as the origin point; however, the configuration is not limited thereto, and other origin points may be used.

INDUSTRIAL APPLICABILITY

It is possible to use the present disclosure in the technical field of mounting a light emitting component onto a board.

REFERENCE SIGNS LIST 10 mounting system, 11 mounting device, 18 conveyance section, 21 collection section, 20 supporting board, 22 conveyor belt, 23 support pin, 24 mounting head, 26 X-axis slider, 28 guide rail, 30 Y-axis slider, 32 guide rail, 34 mark camera, 35 imaging range, 40 nozzle, 42 nozzle holding body, 45 Z-axis motor, 54 parts camera, 56 reel unit, 57 reel, 58 feeder section, 60 control device, 61 CPU, 62 ROM, 63 RAM, 64 HDD, 65 input and output interface, 66 bus, 67 mounting information, 70 board, 75 light emitting component, 76 support board, 77 illuminant, 80 management computer, 87 input device, 88 display.

The invention claimed is:

1. A mounting device which mounts a light emitting component which includes an illuminant onto a board, comprising:
    a component holder to hold the light emitting component;
    a moving structure to cause the component holder to move;
    a single camera configured to image a region which includes at least a portion of the illuminant in the light emitting component to acquire a light emitting component image and to image a fiducial mark which is on the board to acquire a mark image;
    an illuminant coordinates detector to detect coordinates of a specific part of the illuminant based on the light emitting component image;
    a controller configured to
    detect coordinates of the board based on the mark image, and
    control the component holder and the moving structure to perform mounting of the light emitting component such that the light emitting component is held, the light emitting component moves over the board, and the specific part of the illuminant is positioned at predetermined coordinates on the board based on the detected coordinates of the specific part and the detected coordinates of the board, without using information relating to an outer shape of the light emitting component which is based on the light emitting component image.

2. The mounting device according to claim 1, further comprising:
    a positional relationship storage to store a positional relationship between coordinates of the specific part of the illuminant and holding coordinates at which the component holder holds the light emitting component; and
    a mounting coordinates storage to store mounting coordinates on the board in the positional relationship with the predetermined coordinates on the board,
    wherein the controller is configured to derive actual holding coordinates which are in the positional relationship with coordinates of the specific part based on coordinates of the specific part which are detected and the positional relationship, and is configured to control the component holder and the moving structure such that the light emitting component is held at the actual holding coordinates and a portion which is held is disposed at the mounting coordinates.

3. The mounting device according to claim 2,
    wherein the positional relationship is a positional relationship between the specific part of the illuminant and a center of the light emitting component in a case in which a position of the illuminant in the light emitting component is according to a design value.

4. The mounting device according to claim 1,
    wherein the controller is configured to derive a positional relationship between coordinates of the specific part which are detected and predetermined holding coordinates at which the component holder holds the light emitting component, and is configured to control the component holder and the moving structure such that the specific part of the illuminant is positioned at predetermined coordinates on the board based on the positional relationship.

5. The mounting device according to claim 1, wherein the illuminant coordinates detector detects the coordinates of the specific part of the illuminant based on the light emitting component image prior to the mounting of the light emitting component by the component holder.

6. A mounting device which mounts a light emitting component which includes an illuminant onto a board, comprising:
   a component holder to hold the light emitting component;
   a moving structure to cause the component holder to move;
   a single camera configured to image a region which includes at least a portion of the illuminant in the light emitting component to acquire a light emitting component image and to image a fiducial mark which is on the board to acquire a mark image;
   a positional relationship storage to store a positional relationship between coordinates of a specific part of the illuminant and holding coordinates at which the component holder holds the light emitting component and detected coordinates of the board;
   an illuminant coordinates detector to detect the coordinates of the specific part of the illuminant based on the light emitting component image; and
   a controller configured to
   detect the coordinates of the board based on the mark image,
   derive actual holding coordinates which are in the positional relationship with the coordinates of the specific part which are detected and the detected coordinates of the board without using information relating to an outer shape of the light emitting component which is based on the light emitting component image, and
   control the component holder and the moving structure to perform mounting of the light emitting component such that the light emitting component is held at the actual holding coordinates and the portion which is held is disposed at predetermined mounting coordinates.

7. The mounting device according to claim 6, wherein the illuminant coordinates detector detects the coordinates of the specific part of the illuminant based on the light emitting component prior to the mounting of the light emitting component by the component holder.

8. A method for manufacturing a board on which a light emitting component that includes an illuminant is mounted, comprising:
   holding the light emitting component with a component holder;
   moving the component holder with a moving structure;
   imaging with a single camera (i) a region which includes at least a portion of the illuminant in the light emitting component with a camera, to acquire a light emitting component image and (ii) a fiducial mark which is on the board to acquire a mark image;
   detecting coordinates of a specific part of the illuminant based on the light emitting component image with an illuminant coordinates detector;
   detecting, with a controller, coordinates of the board based on the mark image; and
   controlling, with the controller, the component holder and the moving structure to perform mounting of the light emitting component such that the light emitting component is held, the light emitting component moves over the board, and the specific part of the illuminant is positioned at predetermined coordinates on the board based on the detected coordinates of the specific part and the detected coordinates of the board which are detected, without using information relating to an outer shape of the light emitting component which is based on the light emitting component image.

9. The method for manufacturing a board according to claim 8, wherein the detecting coordinates of the specific part of the illuminant is performed prior to mounting of the light emitting component by the component holder.

10. A mounting device which mounts a light emitting component which includes an illuminant onto a board, comprising:
    a component holder to hold the light emitting component and to mount the light emitting component onto the board;
    a moving structure to cause the component holder to move;
    a camera to image a region which includes at least a portion of the illuminant in the light emitting component to acquire a light emitting component image;
    an illuminant coordinates detector to detect coordinates of a specific part of the illuminant based on the light emitting component image prior to the light emitting component being mounted onto the board by the component holder; and
    a controller configured to control the component holder and the moving structure to perform the mounting of the light emitting component such that the light emitting component is held, the light emitting component moves over the board, and the specific part of the illuminant is positioned at predetermined coordinates on the board based on the detected coordinates of the specific part, without using information relating to an outer shape of the light emitting component which is based on the light emitting component image.

11. A method for manufacturing a board on which a light emitting component that includes an illuminant is mounted, comprising:
    holding the light emitting component with a component holder;
    moving the component holder with a moving structure;
    imaging a region which includes at least a portion of the illuminant in the light emitting component with a camera, to acquire a light emitting component image;
    detecting coordinates of a specific part of the illuminant based on the light emitting component image prior to mounting of the light emitting component onto the board using the component holder; and
    controlling, with a controller, the component holder and the moving structure to perform the mounting of the light emitting component such that the light emitting component is held, the light emitting component moves over the board, and the specific part of the illuminant is positioned at predetermined coordinates on the board based on the detected coordinates of the specific part, without using information relating to an outer shape of the light emitting component which is based on the light emitting component image.

* * * * *